United States Patent [19]
Yamamichi et al.

[11] Patent Number: 5,670,408
[45] Date of Patent: Sep. 23, 1997

[54] THIN FILM CAPACITOR WITH SMALL LEAKAGE CURRENT AND METHOD FOR FABRICATING THE SAME

[75] Inventors: Shintaro Yamamichi; Yoichi Miyasaka, both of Tokyo, Japan

[73] Assignee: NEC Corporation, Tokyo, Japan

[21] Appl. No.: 510,488

[22] Filed: Aug. 2, 1995

Related U.S. Application Data

[62] Division of Ser. No. 370,457, Jan. 9, 1995, Pat. No. 5,530,279, which is a continuation of Ser. No. 213,511, Mar. 16, 1994, abandoned.

[30] Foreign Application Priority Data

Mar. 17, 1993 [JP] Japan ............... 5-056640

[51] Int. Cl.$^6$ ............... H01L 21/8242
[52] U.S. Cl. ............... 437/60; 437/47; 437/52; 437/919; 148/DIG. 14
[58] Field of Search ............... 437/47, 52, 60, 437/195, 919; 148/DIG. 14

[56] References Cited

U.S. PATENT DOCUMENTS

| | | |
|---|---|---|
| 5,293,510 | 3/1994 | Takenaka . |
| 5,568,352 | 10/1996 | Hwang ............... 437/919 |
| 5,576,928 | 11/1996 | Summerfelt et al. ............... 437/60 |
| 5,585,300 | 12/1996 | Summerfelt ............... 437/60 |

FOREIGN PATENT DOCUMENTS

| | | |
|---|---|---|
| 2-183569 | 7/1990 | Japan . |
| 4-63471 | 2/1992 | Japan . |
| 4-101453 | 4/1992 | Japan . |
| 4-167554 | 6/1992 | Japan . |
| 4-307968 | 10/1992 | Japan . |

OTHER PUBLICATIONS

T. Ema et al., "3–Dimensional Stacked Capacitor Cell for 16M and 64M DRAMs", *International Electron Devices Meeting Digest of Technical Paper*, 1988, pp. 592–594.

*Primary Examiner*—Charles L. Bowers, Jr.
*Assistant Examiner*—Toniae M. Thomas
*Attorney, Agent, or Firm*—Sughrue, Mion, Zinn, Macpeak and Seas

[57] ABSTRACT

A thin film capacitor uses a dielectric film of high dielectric constant. A lower electrode is disposed on a contact, an interlayer insulating film is in contact with the lower electrode, a dielectric film of high dielectric constant covers the lower electrode, and an upper electrode covers the dielectric film. Thicknesses of the dielectric film at lower end portions of the lower electrode are thin but thick enough to make a leakage current value lower than a tolerable value thereof. At locations immediately below the lower electrode, the interlayer insulating film has portions whose thicknesses are larger than thicknesses of other portions thereof. The interlayer insulating film is such that, immediately below the regions of the dielectric film which are located at lower end portions of sides of the lower electrode and at which thicknesses of the dielectric film are very thin, the thicknesses of the interlayer insulating film are made larger than the rest thereof, or the dielectric film is such that lower end portions thereof are thin but thick enough to make a leakage current value lower than a tolerable value thereof. In this way, the occurrence of leakage current at the lower end portions of the lower electrode is suppressed.

4 Claims, 5 Drawing Sheets

THIN FILM CAPACITOR WITH SMALL LEAKAGE CURRENT AND METHOD FOR FABRICATING THE SAME

This is a divisional of application Ser. No. 08/370,457, filed Jan. 9, 1995, U.S. Pat. No. 5,534,279 which is a Continuation of application Ser. No. 08/213,511, filed Mar. 16, 1994, now abandoned.

BACKGROUND OF THE INVENTION

(1) Field of the Invention

The present invention relates to a thin film capacitor for use in an integrated circuit, and more particularly to a thin film capacitor wherein an increase in the leakage current at lower end portions of a lower electrode is suppressed. The present invention also relates to a method for fabricating such thin film capacitor.

(2) Description of the Related Art

A conventional thin film capacitor for a semiconductor integrated circuit of the kind to which the present invention relates is constituted by a structure in which electrodes are formed of polysilicon and a silicon oxide film and a silicon nitride film are stacked as a dielectric layer between the electrodes. A technique for forming a capacitor after the formation of transistors and bit lines in a dynamic random access memory (DRAM) is disclosed, for example, in International Electron Devices Meeting Digest of Technical Papers, 1988, pp 592–595.

In the above conventional thin film capacitor, there is a limit to the extent in which a capacitor area can be scaled down to meet a need for increasing integration density in recent integrated circuits. Therefore, it is forced to effect the reduction of capacitor areas by making films thinner and dielectric constant higher or using a three dimensional structure at dielectric portions of the thin film capacitor. The dielectric films forming the conventional capacitor are silicon oxide films or silicon nitride films whose dielectric constant is at the most 7 so that, in order to achieve the capacitance needed, the films are required to be so thin as 5 nm or less in a value converted to a silicon oxide film. On the other hand, by using such a thin film, it is extremely difficult to realize the dielectric films that have current-voltage characteristics with currents lower than tolerable leakage currents. Even where the three dimensional structure is used in an attempt to reduce an effective electrode area, the lower ends of the dielectric film at sides of the lower electrode inevitably become so thin that the leakage current is caused to increase due to the concentration of electric fields.

Therefore, it may be attempted to realize the required capacitance by using films having larger thicknesses than in the case of, for example, silicon oxide films. To this end, for the formation of the capacitor portion, use may be made of $SrTiO_3$ having a dielectric constant close to 300 in a room temperature, $(Ba,Sr)TiO_3$, $Pb(Zr,Ti)O_3$ or $Pb(Mg,Nb)O_3$ having a still higher dielectric constant, or a dielectric material of a high dielectric constant typically represented by $Pb(Mg,W)O_3$. For the lower electrode, use may be made of Pt/Ta, Pt/Ti or $RuO_x$ which suppresses diffusion of silicon and does not form a low dielectric constant film even under an oxygen atmosphere during the deposition of high dielectric films.

However, the above attempt fails because, at the lower end portions of the side faces of the lower electrode, it is unavoidable for the thickness of the dielectric film to be reduced and for the leakage current to be increased due to the concentration of electric fields. This is attributable to the fact that the dielectric material of high dielectric constant and the Pt/Ta of the lower electrode are subjected to physical vapor deposition methods such as, typically, sputtering or evaporation methods and also to the fact that the processing residue having occurred at side portions of the mask during the dry-etching results in rugged surfaces around the processed patterns after the removal of the resists.

SUMMARY OF THE INVENTION

An object of the present invention, therefore, is to overcome to the problems existing in the prior art and to provide an improved thin film capacitor and an improved method for forming the same.

According to the invention, in order to overcome the problems associated to an increase in leakage current at lower end portions of the side faces of the lower electrode, the thickness of an interlayer insulating film immediately below the lower electrode is made thicker than that at the remaining regions thereof so that the decrease in the thickness of the dielectric film of high dielectric constant at the lower end portions of the sides of the lower electrode is counterbalanced by the interlayer insulating film of low dielectric constant, thereby suppressing an increase in the leakage current and enabling to realize higher capacitance density.

According to one aspect of the invention, there is provided a thin film capacitor in a form of stacked structure, comprising:

an interlayer insulating film disposed on a semiconductor substrate;

a lower electrode disposed on a contact which is provided in the interlayer insulating film;

a dielectric film of high dielectric constant which covers a top surface and side surfaces of the lower electrode and an upper surface of the interlayer insulating film, the dielectric film being such that thicknesses thereof at lower end portions of the lower electrode are thin but thick enough to make a leakage current value lower than a tolerable value thereof; and an upper electrode which covers an entire upper surface of the dielectric film, wherein the interlayer insulating film has, at locations immediately below the lower electrode, portions whose thicknesses are larger than thicknesses of other portions of the interlayer insulating film.

In the thin film capacitor using the dielectric film of high dielectric constant according to the invention, or the thin film capacitor fabricated using the method according to the invention, the occurrence of leakage current is suppressed at regions of the dielectric film which are located at lower end portions of the lower electrode and at which the thickness of the dielectric film is very thin. In one aspect, as explained above, the interlayer insulating film is such that the thickness thereof at locations immediately below the lower electrode are large. Where the total surface area of the sides of the lower electrode is larger than the surface area of the top of the lower electrode, the deposition time is so controlled that the thickness of the film deposited on the sides of the lower electrode will be a thickness sufficient to provide the necessary capacitance density. In another aspect, the dielectric film is such that lower end portions thereof are thin but thick enough to make a leakage current value lower than a tolerable value thereof. The dielectric film is formed by a physical vapor deposition method whereby the film is deposited sufficiently thick with bulged out portions being formed in the deposited film and, with the bulged out portions used as masks, the dielectric film is etched back.

BRIEF DESCRIPTION OF THE DRAWINGS

The above and other objects, features and advantages of the present invention will be apparent from the following description of preferred embodiments of the invention explained with reference to the accompanying drawings, in which:

FIG. 8 is a graph showing a comparison of the capacitance-voltage characteristics between those of the capacitor according to the invention and those of the prior art.

PREFERRED EMBODIMENTS OF THE INVENTION

Now, preferred embodiments of the invention are explained with reference to the drawings.

Figure 1:
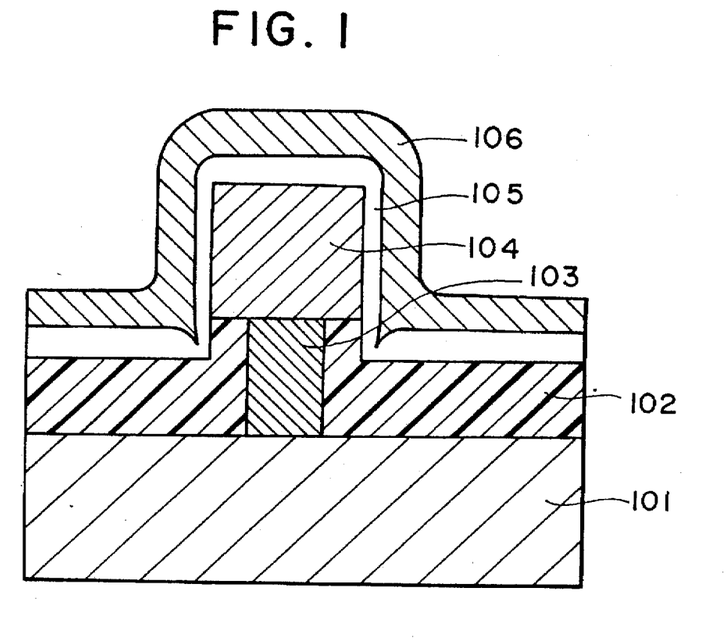
FIG. 1 is a diagram showing a thin film capacitor of a first embodiment according to the invention.

FIG. 1 diagrammatically shows a thin film capacitor of a first embodiment according to the invention. The reference numeral 101 denotes an n-type silicon substrate having a resistance of 0.01 $\Omega$cm, 102 denotes an interlayer insulating film of $SiO_2$ (500 nm), 103 denotes a contact of polysilicon doped with phosphorus (P), 104 denotes a lower electrode of $RuO_2$ (500 nm)/Ru (50 nm), 105 denotes a dielectric film of $(Ba_{0.5},Sr_{0.5})TiO_3$ (100 nm), and 106 denotes an upper electrode of Al (1 $\mu$m)/TiN (50 nm). The high dielectric constant film 105 of $(Ba_{0.5},Sr_{0.5})TiO_3$ is formed by an ion beam sputtering method which is a kind of physical vapor deposition method, so that the thickness of a portion thereof located above the lower electrode 104 is thicker than the thicknesses of portions located at sides of the lower electrode 104. Where, Within the entire surface area of the lower electrode 104, the area at the sides thereof is larger than the area at the upper portion thereof, the deposition time is so controlled that the thickness of the $(Ba_{0.5},Sr_{0.5})TiO_3$ film 105 deposited on the sides of the lower electrode will be a thickness sufficient to provide the necessary capacitance density.

As noted in FIG. 1, the thickness of the interlayer insulating film $SiO_2$ 102 immediately below the lower electrode 104 of $RuO_2$/Ru is larger than other regions of the interlayer insulating film. Thus, the portions where the dielectric $(Ba_{0.5},Sr_{0.5})TiO_3$ film 105 of a high dielectric constant become very thin are at peripheral portions near the steps formed in the interlayer $SiO_2$ insulating film 102, and the thicknesses of the dielectric film 105 at the overall sides of the lower electrode 104 are substantially constant or the same.

Figure 2:
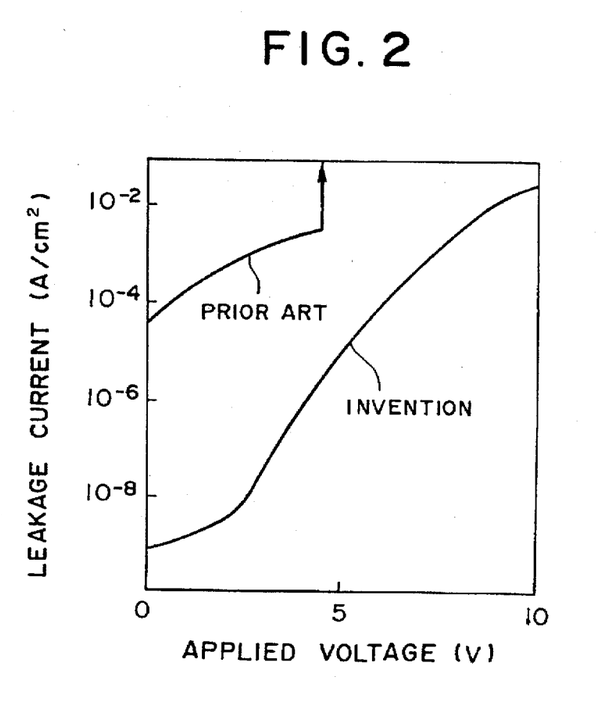
FIG. 2 is a graph showing a comparison of the current-voltage characteristics between those of the capacitor according to the invention and those of the prior art.

FIG. 2 shows, in a graph, a comparison of the current-voltage characteristics between those of the capacitor according to the invention and those of the prior art.

FIGS. 3A–3D are diagrams for explaining process steps of the method for fabricating a thin film capacitor as a second embodiment according to the invention. The reference numeral 301 denotes an n-type silicon substrate having a resistance of 0.01 $\Omega$cm, 302 denotes an interlayer insulating film of $SiO_2$ (500 nm), 303 denotes a contact of polysilicon doped with phosphorus (P), 304 denotes a lower electrode of $RuO_2$ (500 nm)/Ru (50 nm), 305 denotes a dielectric film $(Ba_{0.5},Sr_{0.5})TiO_3$ (100 nm), and 308 denotes an upper electrode of Al (1 $\mu$m)/TiN (50 nm).

Figure 3A:
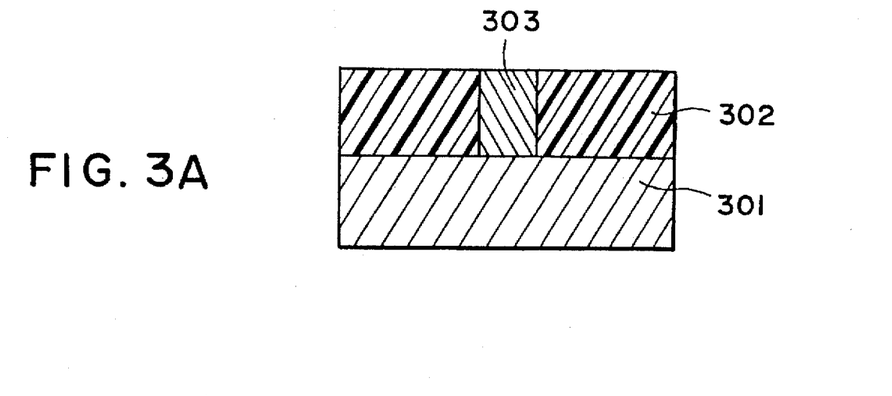
FIGS. 3A–3D are diagrams for showing sequential steps for fabricating a thin film capacitor of a second embodiment according to the invention.

The interlayer insulating film 302 of $SiO_2$ is formed by thermally oxidizing the silicon substrate 301 and a contact hole is provided at a predetermined location. Then, the contact hole is filled by a polysilicon film 303 formed and diffused with phosphorus. The polysilicon film 303 is etched-back whereby the film other than that in the contact hole is removed as shown in FIG. 3A.

Figure 3B:
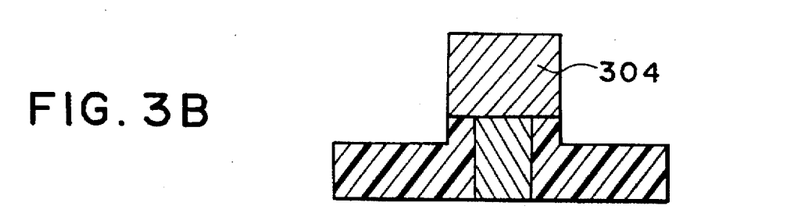

Then, the lower electrode 304 of $RuO_2$ (500 nm)/Ru (50 nm) which is a two layer film is deposited by a DC magnetron sputtering technique. Here, the lower electrode $RuO_2$/Ru 304 is processed for a desired size by using a mixture of $CF_4$ gas and $O_2$ gas, and the portions of the interlayer insulating film 302 that are located immediately below the lower electrode $RuO_2$/Ru 304 are over-etched and removed by about 100 nm as shown in FIG. 3B.

Figure 3C:
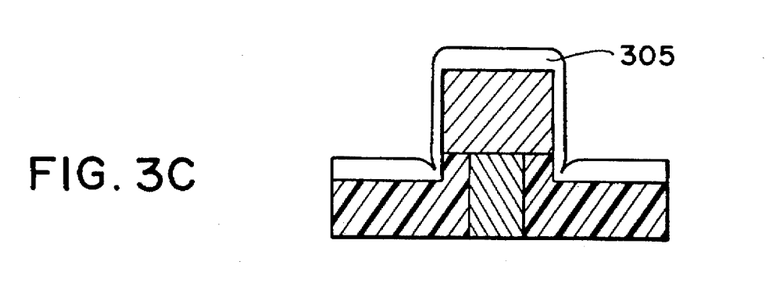

Thereafter, as shown in FIG. 3C, the dielectric film 305 of $(Ba_{0.5},Sr_{0.5})TiO_3$ (100 nm) is formed by an ion beam sputtering method, which is one form of physical vapor deposition method, under the substrate temperature of 600° C., beam voltage of 1000V and beam current of 40 mA. At this time, the portion of the dielectric film that is located above the lower electrode 304 results in a larger thickness than the thicknesses of portions located at sides of the lower electrode 304. Where, within the entire surface area of the lower electrode 304, the area at the sides thereof is larger than the area at the upper portion thereof, the film forming time period is so controlled that the thickness of the $(Ba_{0.5},Sr_{0.5})TiO_3$ film 305 deposited on the sides of the lower electrode will be a thickness sufficient to provide the necessary capacitance density.

Figure 3D:
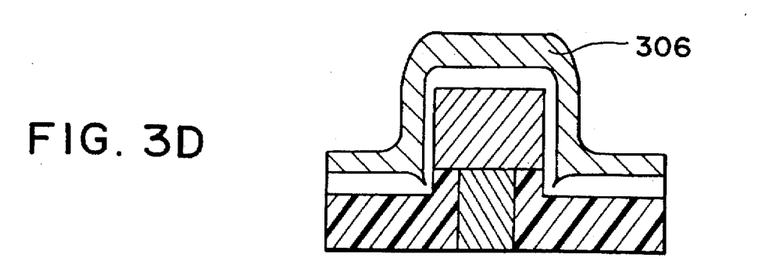

Then, as shown in FIG. 3D, the upper electrode 306 of Al (1 $\mu$m)/TiN (50 nm) is formed by a DC magnetron sputtering method and is processed into in a predetermined shape. This completes the formation of the thin film capacitor.

The thin film capacitor thus fabricated was measured for the current-voltage characteristics, the result of which is shown in a graph of FIG. 2. It is seen therein that the characteristics obtained show a significant improvement over the prior art.

FIGS. 4A–4D are diagrams for explaining process steps of the method for fabricating a thin film capacitor as a third embodiment according to the invention. The reference numeral 401 denotes an n-type silicon substrate having a resistance of 0.01 $\Omega$cm, 402 denotes a first interlayer insulating film of $SiO_2$ (500 nm), 403 denotes a second interlayer insulating film of Boro-phosphosilicate glass (BPSG) (100 nm), 404 denotes a contact of polysilicon doped with phosphorus (P), 405 denotes a lower electrode of $RuO_2$ (500 nm)/Ru (50 nm), 406 denotes a dielectric film $(Ba_{0.5},Sr_{0.5})TiO_3$ (100 nm), and 407 denotes an upper electrode of Al (1 $\mu$m)/TiN (50 nm).

Figure 4A:
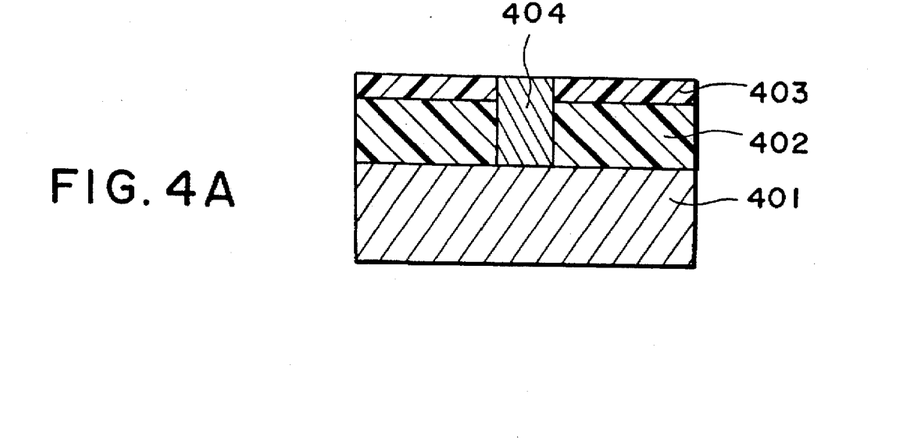
FIGS. 4A–4D are diagrams for showing sequential steps for fabricating a thin film capacitor of a third embodiment according to the invention.

The first interlayer insulating film 402 of $SiO_2$ is formed by thermally oxidizing the silicon substrate 401 and, on such film, the second interlayer insulating film (BPSG) 403 is formed by a low-pressure chemical vapor deposition (LP-CVD) process. Then, a contact hole is provided at a predetermined location, and a polysilicon film 404 is formed and is diffused with phosphorus. The contact hole is filled by this film 404 followed by an etching-back process to remove the film at portions other than at the contact hole as shown in FIG. 4A.

Figure 4B:
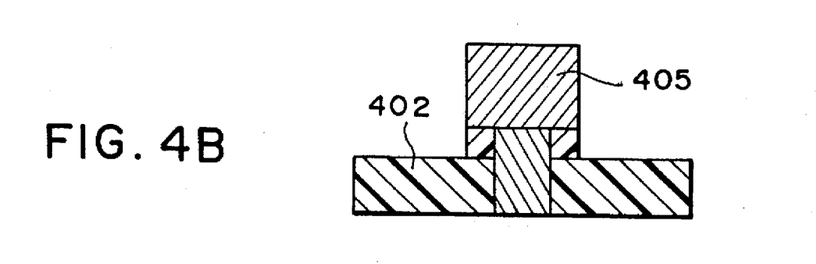

Then, the lower electrode 405 of $RuO_2$ (500 nm)/Ru (50 nm) which is a two layer film is deposited by a DC magnetton sputtering technique. Here, the lower electrode $RuO_2$/Ru 405 is processed for a desired size by using a mixture of $CF_4$ gas and $O_2$ gas followed by a vapor phase HF process to etch away the BPSG film 403 except the portion thereof immediately below the lower electrode 405 as shown in FIG. 4B. Since the etching rate of $SiO_2$ is less than about 1/10 that of BPSG with respect to the HF gas, only the BPSG film is selectively etched away.

Figure 4C:
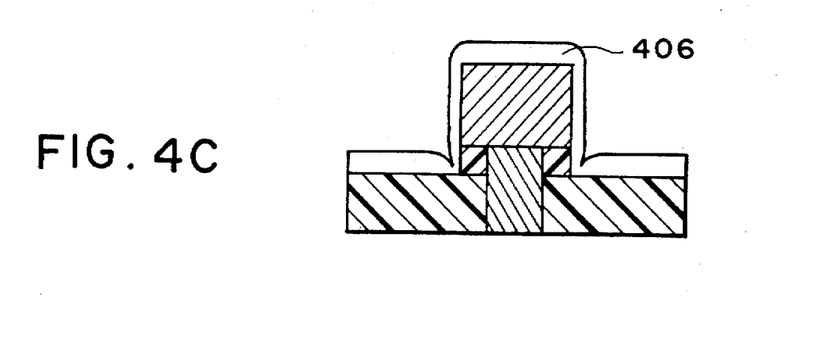

Thereafter, as shown in FIG. 4C, the dielectric film 408 of $(Ba_{0.5},Sr_{0.5})TiO_3$ (100 nm) is formed by an ion sputtering method, which is one form of physical vapor deposition method, under the substrate temperature of 600° C., beam voltage of 1000V and beam current of 40 mA. At this time, the portion of the dielectric film that is located above the lower electrode 405 results in a larger thickness than the thicknesses of portions located at sides of the lower electrode 405. Where, within the entire surface area of the entire lower electrode 405, the area at the sides thereof is larger than the area at the upper portion thereof, the film forming time period is so controlled that the thickness of the $(Ba_{0.5},Sr_{0.5})TiO_3$ film 406 deposited on the sides of the lower electrode 405 will be a thickness sufficient to provide the necessary capacitance density.

Figure 4D:
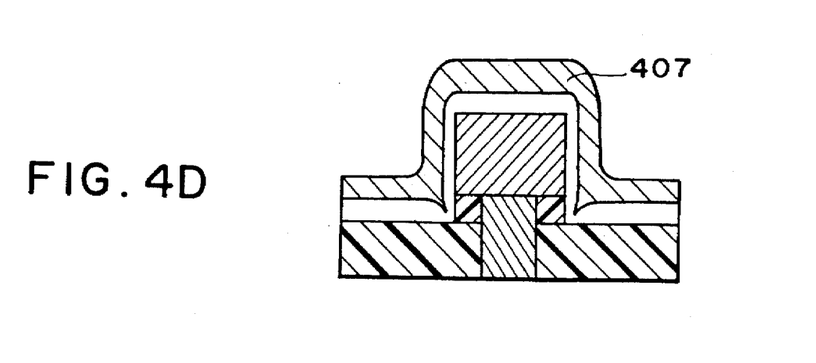

Then, the upper electrode 407 of Al (1 μm)/TiN (50 nm) is formed by a DC magnetron sputtering method and is processed into in a predetermined shape as shown in FIG. 4D. This completes the formation of the thin film capacitor.

The thin film capacitor fabricated as above has shown similar trends in the current-voltage characteristics as shown in FIG. 2, with such characteristics being significantly improved over those in the prior art. Also, this third embodiment has advantages over the second embodiment according to the invention in the aspects of reproducibility and mass production because the thickness of the interlayer insulating film to remain immediately below the lower electrode is determined by the thickness of the BPSG film deposited.

FIGS. 5A–5D are diagrams for explaining process steps of the method for fabricating a thin film capacitor as a fourth embodiment according to the invention. The reference numeral 501 denotes an n-type silicon substrate having a resistance of 0.01 Ωcm, 502 denotes an interlayer insulating film of $SiO_2$ (500 nm), 503 denotes a contact of polysilicon doped with phosphorus (P), 504 denotes a lower electrode of $RuO_2$ (500 nm)/Ru (50 nm), 505 denotes a dielectric film of $(Ba_{0.5},Sr_{0.5})TiO_3$ (100 nm), and 506 denotes an upper electrode of Al (1 μm)/TiN (50 nm).

Figure 5A:
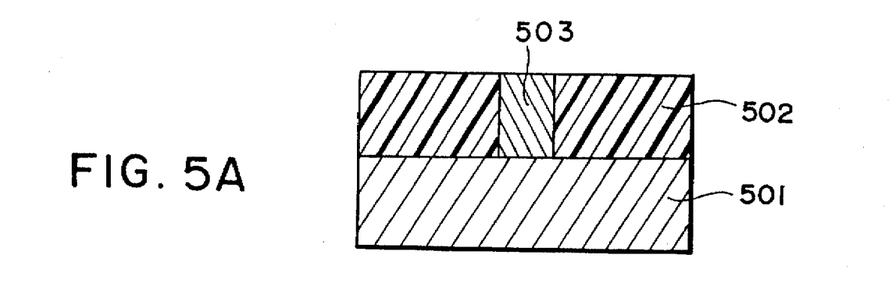
FIGS. 5A–5D are diagrams for showing sequential steps for fabricating a thin film capacitor of a fourth embodiment according to the invention.

The interlayer insulating film of $SiO_2$ 502 is formed by thermally oxidizing the silicon substrate 501 and a contact hole is provided at a predetermined location. The contact hole is filled with a polysilicon film 503 formed and diffused with phosphorus. The film 503 is etched-back whereby the film is removed except that in the contact hole as shown in FIG. 5A.

Figure 5B:
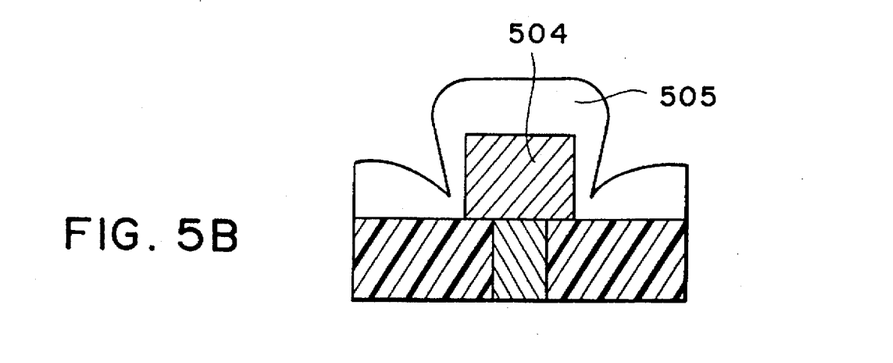
Figure 6:
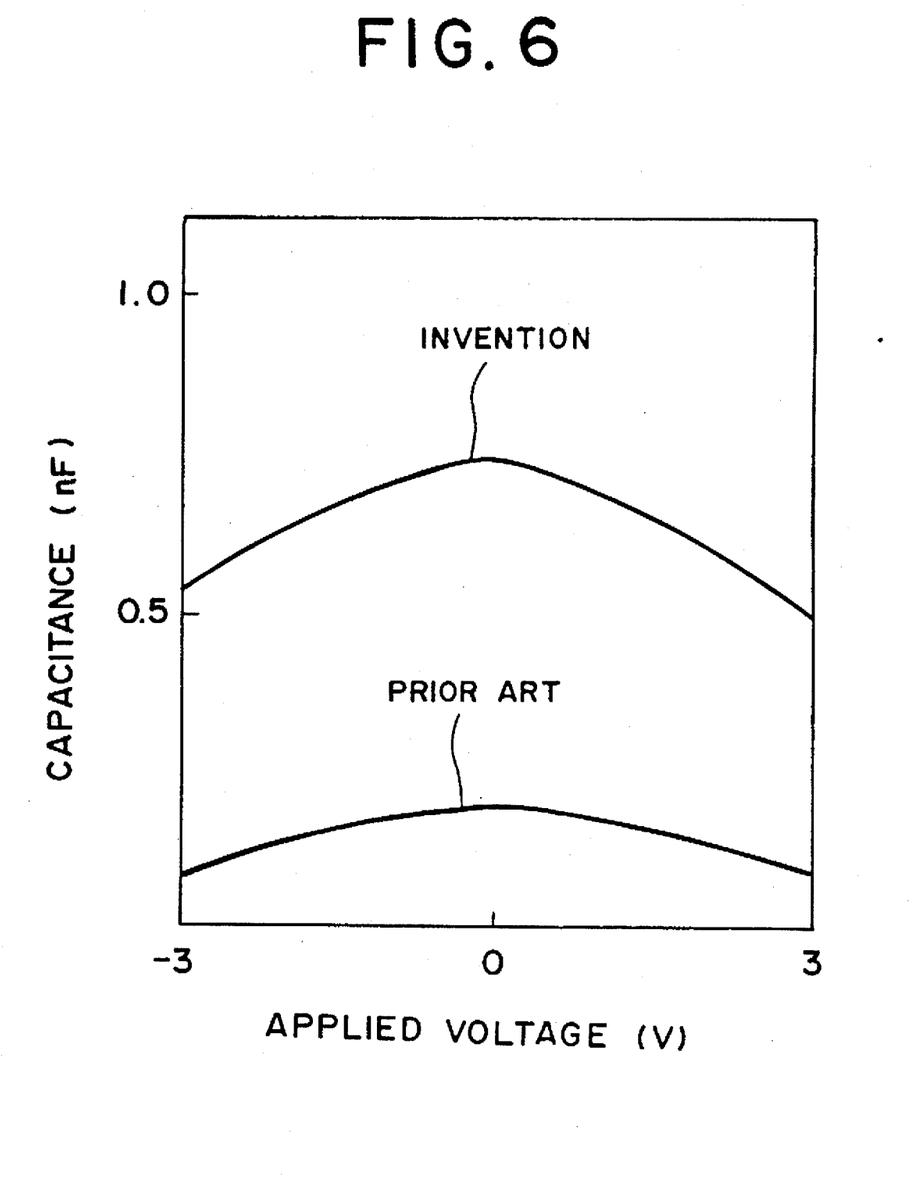

Then, the lower electrode 504 of $RuO_2$ (500 nm)/Ru (50 nm) which is a two layer film is deposited by a DC magnetron sputtering technique, and this lower electrode $RuO_2$/Ru is processed to be shaped into a desired size as shown in FIG. 5B using a mixture gas of $CF_4$ gas and $O_2$ gas. Thereafter, the dielectric film 505 of $(Ba_{0.5},Sr_{0.5})TiO_3$ (100 nm) is formed by an ion beam sputtering method, which is one form of physical vapor deposition method, under the substrate temperature of 600° C., beam voltage of 1000V and beam current of 40 mA. At this time, the dielectric film is formed in such a way that the thicknesses thereof at the lower end portions of the sides of the lower electrode 504 are large enough to make the leakage current value lower than the tolerable value thereof. Therefore, as also seen in FIG. 5B, the dielectric film $(Ba_{0.5},Sr_{0.5})TiO_3$ 505 is deposited thicker around the upper periphery of the lower electrode 504 and on the $SiO_2$ interlayer insulating film 502. According to the conventional method, the upper electrode 506 of Al (1 μm)/TiN (50 nm) is deposited under this state using a DC magnetron sputtering method followed by a process for shaping the same into a desired shape. As an experiment for comparison purposes, the thin film capacitor was formed using such conventional method and the bias voltage dependency of the capacitor was measured. The results of the comparison are shown in FIG. 6 as the capacitance-voltage characteristics.

Figure 5C:
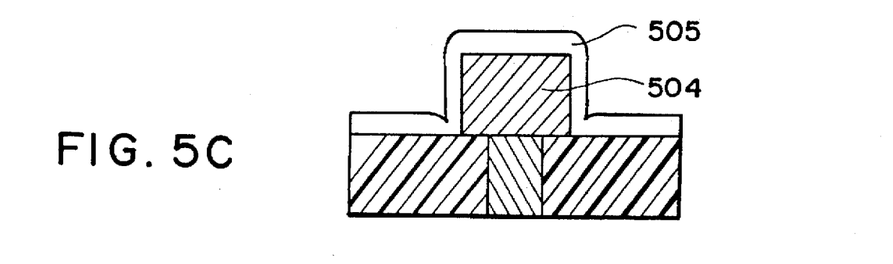
Figure 5D:
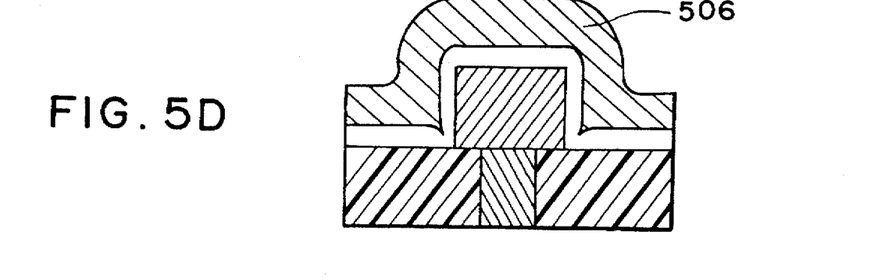

In this embodiment according to the invention, after the formation of the dielectric film 505 of $(Ba_{0.5},Sr_{0.5})TiO_3$ as above, an ion milling process is carried out whereby the entire surface of the dielectric film is etched in the vertical direction under a beam voltage of 700V and a beam current of 500 mA. Since the upper periphepal portion of the dielectric film on the lower electrode bulges out due to the increased thickness of the film deposited thereat, the bulged out portion serves as a beam blocking hood so that the particular portions of the dielectric film 505 at the lower end portions of the sides of the lower electrode 504 that have the most reduced thicknesses are not etched as shown in FIG. 5C. The etching is stopped at the point when the thickness of the dielectric film 505 on the lower electrode 504 becomes one half the thickness thereof before the starting of etching.

Then, the upper electrode 506 of Al (1 μm)/TiN (50 nm) is formed by a DC magnetton sputtering method and is processed into in a predetermined shape. The bias voltage dependency of the capacitor values of the thin film capacitor thus fabricated has been measured, the result of which is shown in FIG. 6.

Since the film thicknesses of the portions of the dielectric film 505 at the sides of the lower electrode 504 are reduced by the etching-back, the capacitance value becomes two times the corresponding value obtained from the experiment for comparison explained above. No difference is seen in the leakage current values between the case where the etching-back is performed and the case where such is not performed, and the leakage current values are in any case below the tolerable values.

In all of the above four embodiments of the invention, the high dielectric constant film is formed of $(Ba_{0.5},Sr_{0.5})TiO_3$. However, for the high dielectric constant film, there are others which can also be effectively used and in which, in the chemical formula represented by $ABO_3$, at least one element is selected as A from a group consisting of Ba, Sr, Pb, La, Li and K and at least one element is selected as B from a group consisting of Zr, Ti, Ta, Nb, Mg, Mn, Fe, Zn and W, respectively, with the examples thereof being $SrTiO_3$, $PbTiO_3$, $Pb(Zr,Ti)O_3$, $(Pb,La)(Zr,Ti)O_3$, $Pb(Mg,Nb)O_3$, $Pb(Mg,W)O_3$, $Pb(Zn,Nb)O_3$, $LiTaO_3$, $LiNbO_3$, $KTaO_3$ and $KNbO_3$. The examples other than those represented by the above chemical formula are $Ta_2O_5$, $Bi_4Ti_3O_{12}$ and $BaMgF_4$. Also, although the lower electrode is formed of $RuO_2$/Ru, the structure may be such that Pt is used as the lower electrode with a barrier layer provided thereunder formed of Ta, TiN, etc.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a thin film capacitor, comprising the steps of:

depositing an interlayer insulating film on a semiconductor substrate;

providing a contact at a first location in said interlayer insulating film;

depositing a lower electrode on said contact and said interlayer insulating film;

over-etching said interlayer insulating film for partially removing said interlayer insulating film;

forming a dielectric film of high dielectric constant by a physical vapor deposition method for covering a projected portion constituting said lower electrode; and forming an upper electrode on said dielectric film of high dielectric constant.

2. The method for fabricating a thin film capacitor according to claim 1, in which said dielectric film of high dielectric constant is formed by an ion beam sputtering method.

3. The method for fabricating a thin film capacitor according to claim 1, which comprises the steps of:

depositing at least two kinds of layers having etching rates different from each other in forming said interlayer insulating film; and removing said layers of interlayer insulating film except a layer thereof immediately below said lower electrode after the formation of said lower electrode on said contact and said interlayer insulating film.

4. A method for fabricating a thin film capacitor, comprising the steps of:

providing a contact at a first location after depositing an interlayer insulating film on a substrate;

forming a lower electrode on said contact and said interlayer insulating film and shaping said lower electrode into a desired size;

forming a dielectric film of high dielectric constant by a physical vapor deposition method with such film being sufficiently thick to cover a projected portion constituting said lower electrode;

etching-back said dielectric film of high dielectric constant by using portions of said dielectric film that are deposited at sides of said lower electrode used as masks; and forming an upper electrode on an etched-back surface of said dielectric film of high dielectric constant.

* * * * *

UNITED STATES PATENT AND TRADEMARK OFFICE
CERTIFICATE OF CORRECTION

PATENT NO.   : 5,670,408
DATED        : September 23, 1997
INVENTOR(S)  : Yamamichi et al.

It is certified that error(s) appears in the above-identified patent and that said Letters Patent is hereby corrected as shown below:

col. 3, line 25, delete "8" and insert --6-- col. 4, line 9, delete "308" and insert --306-- col. 4, line 25, delete "abont" and insert --about-- col. 5, line 8, delete "magnetton" and insert --magnetron-- col. 5, line 40, delete "reproduclbllity" and insert --reproducibility--, p. 13, line 2.

Signed and Sealed this

Twenty-seventh Day of January, 1998

*Attest:*

BRUCE LEHMAN

*Attesting Officer*   *Commissioner of Patents and Trademarks*